US012033933B2

(12) United States Patent
Lv

(10) Patent No.: US 12,033,933 B2
(45) Date of Patent: Jul. 9, 2024

(54) SEMICONDUCTOR STRUCTURES AND METHODS FOR FORMING THE SAME

(71) Applicant: CHANGXIN MEMORY TECHNOLOGIES, INC., Hefei (CN)

(72) Inventor: Kaimin Lv, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 194 days.

(21) Appl. No.: 17/432,191

(22) PCT Filed: Mar. 10, 2021

(86) PCT No.: PCT/CN2021/079980
§ 371 (c)(1),
(2) Date: Aug. 19, 2021

(87) PCT Pub. No.: WO2021/203900
PCT Pub. Date: Oct. 14, 2021

(65) Prior Publication Data
US 2023/0118163 A1   Apr. 20, 2023

(30) Foreign Application Priority Data
Apr. 10, 2020   (CN) .................. 202010279542.2

(51) Int. Cl.
H01L 23/498 (2006.01)
H01L 21/48 (2006.01)
H01L 23/00 (2006.01)

(52) U.S. Cl.
CPC .... *H01L 23/49838* (2013.01); *H01L 21/4846* (2013.01); *H01L 24/13* (2013.01);
(Continued)

(58) Field of Classification Search
CPC .......... H01L 23/49838; H01L 21/4846; H01L 24/13; H01L 24/16; H01L 24/81;
(Continued)

(56) References Cited

U.S. PATENT DOCUMENTS 8,241,963 B2   8/2012   Shen et al.
8,604,624 B2   12/2013  Kim et al.
(Continued)

FOREIGN PATENT DOCUMENTS

CN   101431037 A   5/2009
CN   102332435 A   1/2012

OTHER PUBLICATIONS

CN Office Action cited in CN202010279542.2, dated Apr. 29, 2023, 10 pages.
(Continued)

*Primary Examiner* — Douglas W Owens
(74) *Attorney, Agent, or Firm* — Cooper Legal Group, LLC

(57) ABSTRACT

The present disclosure relates to the technical field of semiconductor packaging, and discloses a semiconductor structure and a method for forming the same. The method includes: providing a chip, the chip having interconnect structures on its surface, the top of the interconnect structures having an exposed fusible portion; providing a substrate, the substrate having conductive structures on its surface; patterning the conductive structures so that edges of the conductive structures have protrusions; combining the chip with the substrate.

6 Claims, 3 Drawing Sheets

(52) U.S. Cl.
CPC .............. *H01L 24/16* (2013.01); *H01L 24/81* (2013.01); *H01L 2224/13553* (2013.01); *H01L 2224/13611* (2013.01); *H01L 2224/16225* (2013.01); *H01L 2224/81815* (2013.01); *H01L 2924/1436* (2013.01); *H01L 2924/182* (2013.01); *H01L 2924/37001* (2013.01)

(58) Field of Classification Search
CPC . H01L 2224/13553; H01L 2224/13611; H01L 2224/16225; H01L 2224/81815; H01L 2924/1436; H01L 2924/182; H01L 2924/37001; H01L 2224/10175; H01L 2224/11831; H01L 2224/13017; H01L 2224/13019; H01L 2224/13082; H01L 2224/131; H01L 2224/13109; H01L 2224/13111; H01L 2224/13144; H01L 2224/13147; H01L 2224/13155; H01L 2224/13157; H01L 2224/13172; H01L 2224/13181; H01L 2224/13186; H01L 2224/81203; H01L 2224/81897; H01L 2224/81906; H01L 24/11; H01L 2224/81193; H01L 2224/81907; H01L 2924/181; H01L 23/488; H01L 2224/81031

See application file for complete search history.

(56) References Cited

U.S. PATENT DOCUMENTS

| | | | |
|---|---|---|---|
| 10,390,440 B1* | 8/2019 | Lo | H05K 3/328 |
| 2011/0127657 A1* | 6/2011 | Oda | H01L 21/6835 |
| | | | 257/E23.056 |
| 2012/0012997 A1 | 1/2012 | Shen et al. | |
| 2012/0273959 A1 | 11/2012 | Park et al. | |
| 2015/0115440 A1* | 4/2015 | Higuchi | H01L 24/13 |
| | | | 257/737 |
| 2015/0318188 A1* | 11/2015 | Liu | H01L 23/5384 |
| | | | 361/767 |
| 2015/0318259 A1* | 11/2015 | Kim | H01L 23/3142 |
| | | | 257/737 |
| 2017/0372997 A1* | 12/2017 | Tsukamoto | H01L 21/4857 |
| 2019/0239361 A1 | 8/2019 | Lo et al. | |
| 2020/0006273 A1* | 1/2020 | Dubey | H01L 24/17 |
| 2020/0403088 A1* | 12/2020 | Aoike | H01L 24/11 |
| 2021/0074662 A1* | 3/2021 | Moitzi | H05K 1/111 |
| 2022/0052001 A1* | 2/2022 | Sato | H01L 24/81 |

OTHER PUBLICATIONS

European Search Report cited in EP21773255.1, dated Jul. 10, 2023, 8 pages.
International Search Report cited in PCT/CN2021/079980 dated May 27, 2021, 8 pages.

* cited by examiner

SEMICONDUCTOR STRUCTURES AND METHODS FOR FORMING THE SAME

CROSS-REFERENCE

The present disclosure claims the priority to Chinese Patent Application 202010279542.2, titled "SEMICONDUCTOR STRUCTURES AND METHODS FOR FORMING THE SAME", filed on Apr. 10, 2020, which is incorporated herein by reference in its entirety.

TECHNICAL FIELD

The present disclosure relates to the field of semiconductor packaging technology, and in particular to a semiconductor structure and a method for forming the same.

BACKGROUND

Dynamic random access memory is a semiconductor memory device widely used in semiconductor memories. As the feature size of semiconductor integrated circuit devices is getting smaller, higher requirements on the semiconductor manufacturing technology are proposed. The existing semiconductor packaging technology is limited. Advanced processed are required to enhance the company's competitiveness.

In the prior art, the gap between the conductive bump and the semiconductor substrate is filled with molding compound. Due to the fallibility or compactness of the molding compound, and the wettability of the solder used in the metal interconnect structures of the chip and the substrate, the welding effect is poor, which in turn leads to product failure in the subsequent molding stage.

Therefore, in the packaging process of semiconductors with reduced feature size, how to avoid product failure of the chip and semiconductor substrate in the subsequent molding stage and also strengthen the weld metal bonding force between the conductive structures and the substrate is a technical problem to be urgently solved.

SUMMARY

The purpose of the present disclosure is to provide a semiconductor structure and a method for forming the same, which can avoid the product failure of the chip and the semiconductor substrate in the subsequent molding stage, and also strengthen the weld metal bonding force between the conductive structures and the substrate.

In order to solve the above-mentioned problem, technical solutions proposed as described herein may provide a semiconductor structure formation method including: providing a chip, the chip having interconnect structures on its surface, a top of the interconnect structure having an exposed fusible portion; providing a substrate, the substrate having conductive structures on its surface;

patterning the conductive structures so that edges of the conductive structures have protrusions; combining the chip with the substrate so that the fusible portion and the conductive structure are initially mechanically bonded, and then heating the fusible portion to a reflow temperature of the fusible portion to bond the fusible portion with the conductive structure by thermocompression.

In some embodiments, the patterning the conductive structures comprises: forming a first mask material layer on the conductive structures, the first mask material layer exposing the edges of the conductive structures; depositing a barrier material layer in the first mask material layer; and removing the first mask material layer and forming the protrusions at the edges of the conductive structures.

In some embodiments, the step of patterning the conductive structures comprises: forming a second mask material layer on the conductive structures, the second mask material layer covering at least edge portions of the conductive structures; and etching the conductive structures along the second mask material layer and forming the protrusions at the edges of the conductive structures.

In some embodiments, the barrier material layer and the conductive structures are made of the same or different materials.

The technical solution of the present disclosure further provides a semiconductor structure, comprising:
a substrate having conductive structures on its surface, the edges of the conductive structures having protrusions; and
a chip having interconnect structures on its surface, the interconnect structures and the conductive structures fitting with each other face to face In some embodiments, a central portion of the conductive structure has a curved groove, and a top surface of the interconnect structure at least partially fits with the curved groove.

In some embodiments, the edges of the conductive structures have protrusions and the protrusions are rectangular, triangular, or curved.

In some embodiments, a top of the interconnect structures has a fusible portion that fits with the conductive structure face to face.

In some embodiments, the conductive structures and the fusible portion are made of different materials.

In some embodiments, a height of the protrusion is at least greater than or equal to one third of a height of the fusible portion.

In some embodiments, the edge of the conductive structure has two or more protrusions, and there is a gap between each protrusion.

The advantage of the present disclosure is that, compared with the existing semiconductor packaging process, the present disclosure is mainly aimed at improving the conductive structures of the substrate. The new structure design can drain the metal solder, thereby avoiding the diffusion of the metal solder along the pattern direction in the subsequent packaging technology, and also avoiding current leakage, short circuit due to poor contact, product failure and other problems between the conductive structures and the semiconductor substrate. Meanwhile, the metal solder and the conductive structures are welded on three sides to further strengthen the bonding force between the weld metals, thereby improving the yield rate of the semiconductor packaging process.

BRIEF DESCRIPTION OF THE DRAWINGS

In order to explain technical solutions of embodiments of the present disclosure more clearly, the accompanying drawings to be used for describing the embodiments of the present disclosure will be introduced simply.

Apparently, the accompanying drawings to be described below are merely some embodiments of the present disclosure. A person of ordinary skill in the art may obtain other drawings according to these drawings without paying any creative effort.

FIGS. 6A-6C are schematic cross-section views of a semiconductor structure in an embodiment of the present disclosure, in which:

100: semiconductor substrate; 200: conductive structure; 300: first mask material layer; 400: fusible portion; 201: interconnect structure; 110: chip; 500: molding compound.

DESCRIPTION OF THE EMBODIMENTS

In order to make the purposes, technical solutions and effects of the present disclosure clearer, the present disclosure will be further elaborated below with reference to the accompanying drawings. It should be understood that the embodiments to be described here are just some embodiments of the present disclosure, rather than all of the embodiments, and are not intended to limit the present disclosure. Based on the embodiments of the present disclosure, all other embodiments obtained by a person of ordinary skill in the art without paying any creative effort should be included in the protection scope of the present disclosure.

Figure 1:
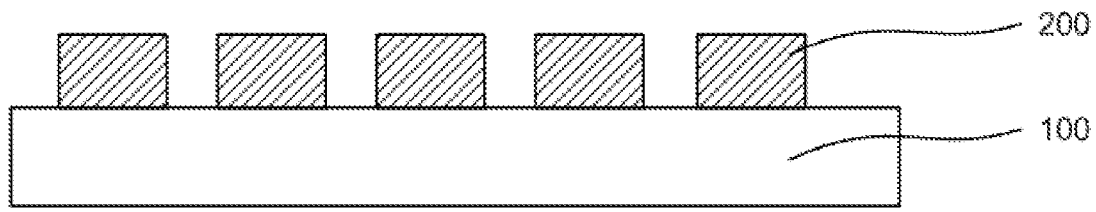
FIGS. 1-4 are schematic views of a semiconductor structure in an embodiment of the present disclosure.

FIG. 1 is a schematic view of a semiconductor structure in an embodiment of the present disclosure.

Specifically, a substrate 100 is provided, and conductive structures 200 arranged at intervals are formed on the surface of the substrate 100.

In the semiconductor packaging technology, the material of the semiconductor substrate 100 is mostly a printed circuit board. For example, aluminum nitride substrates, aluminum silicon carbide substrates and the like may be used. Conductive structures 200 arranged at intervals are formed on the surface of the substrate 100. In this embodiment, the conductive structures 200 may be pads or traces. In the semiconductor packaging technology, the material of the conductive structures 200 comprises at least one of copper, nickel, gold, tantalum, cobalt, indium, vanadium, and titanium nitride.

It may be understood by those skilled in the art that, in the semiconductor packaging technology, the gap between the conductive structures 200 and the semiconductor substrate 100 is filled with molding compound 500. The molding compound 500 is injected after soldering. In other words, if the soldering is not strong enough, poor contact may occur at the solder joints during the subsequent molding by injection of molding compound 500, or the high-temperature molding may lead to the fusion of the solder, resulting in coupling between adjacent structures and short circuit.

Figure 4:
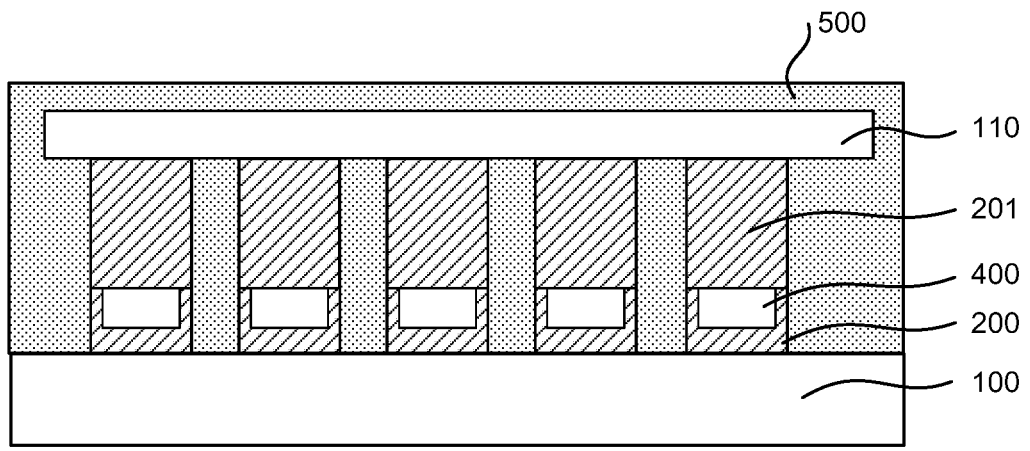
Figure 5:
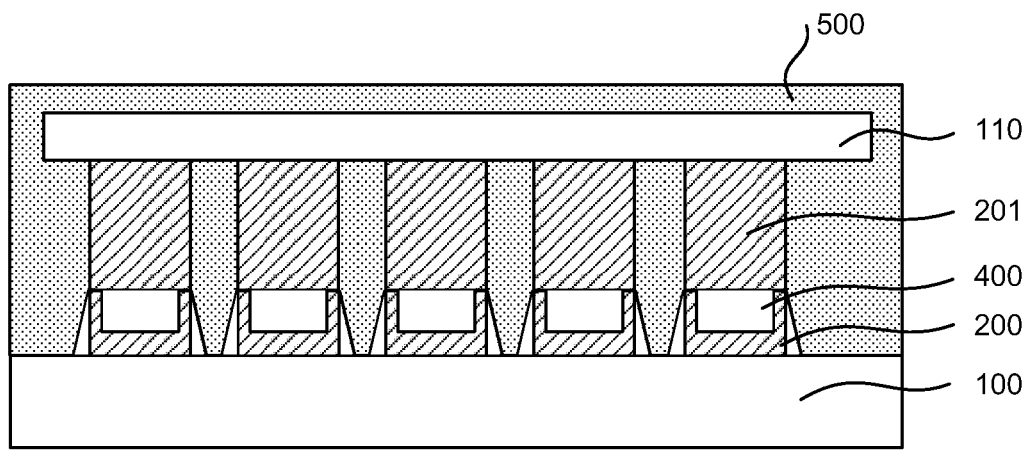
FIG. 5 is a schematic view of a semiconductor structure in the prior art.

Please referring to FIG. 4 and FIG. 5, FIG. 4 shows this embodiment and FIG. 5 shows a technical solution in the prior art. The metal solder is generally tin alloy. The metal welding material is the fusible portion 400 in FIG. 4 and FIG. 5. The fusible portion 400 is located at the top of the interconnect structures 201 on the chip 110, and is used to bond the fusible portion 400 and the conductive structures 200 by thermocompression to form a package of the chip 110 and the substrate 100. Further, since the conductive structures 200 are relatively infusible at the fusion temperature of the fusible portion 400, the materials of the fusible portion 400 and the conductive structures 200 are different.

Patterning the conductive structures 200 specifically comprises the following steps.

Figure 2:
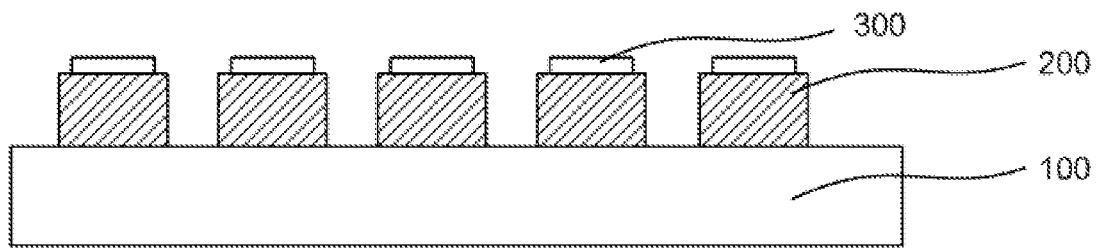
Figure 3:
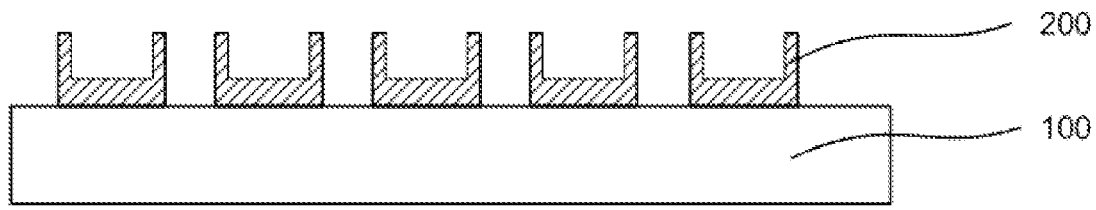

Please referring to FIG. 2, a first mask material layer 300 is deposited on the surface of the conductive structures 200 for etching. Further, referring to FIG. 3, the conductive structures 200 are patterned and etched so that the edges of the conductive structures 200 have protrusions.

A first mask material layer 300 is formed above the conductive structures 200, and the first mask material layer 300 exposes the edges of the conductive structures. A barrier material layer (not shown) is deposited in the first mask material layer 300. The first mask material layer 300 is removed to form protrusions at the edges of the conductive structures. The materials of the barrier material layer (not shown) and the conductive structures 200 may be the same or different. The material of the barrier material layer may be at least one of metals such as nickel, gold, tantalum, cobalt, indium, titanium nitride, vanadium, and may be a dielectric material with good wettability with the conductive structures 200.

Further, a second mask material layer (not shown) is formed above the conductive structures 200, the second mask material layer covering at least the edge portion of the conductive structures 200. The conductive structures 200 are etched along the second mask material layer to form protrusions at the edges of the conductive structures 200.

Specifically, in this embodiment, there are various methods for depositing the mask layer. For example, chemical vapor deposition may be used, in which gases of one or more substances are activated somehow to have chemical reactions on the surface of the substrate and then deposited into a desired solid thin film. Physical vapor deposition may be used, in which the transfer of substances is realized by a certain physical process, that is, atoms or molecules are transferred to the surface of the silicon substrate and deposited into a thin film. Spin coating, electroplating and the like may also be used. For example, in this embodiment, a mask layer with a predetermined thickness is deposited on the surface of the conductive structures 200 by chemical vapor deposition. Controlling the flow rate of the introduced airflow, controlling the flow of the introduced airflow, controlling the deposition time, or controlling the deposition temperature may be used separately. By improving the accuracy in controlling the airflow and temperature, all atoms can be deposited neatly to form a single crystalline layer. Finally, a mask layer with a uniform thickness is obtained on the surface of the conductive structures 200.

The deposition and etching of the plurality of mask layers can enable the conductive structures 200 to be etched with a better effect. Meanwhile, a pattern is formed on the mask layer, and the conductive structures 200 are patterned and etched according to the pattern. According to the actual process requirements, for example, referring to the schematic cross-sectional views of the etched conductive structures 200 in FIGS. 6A-6C, a curved groove is formed in the central portion of the conductive structures 200, and protrusions are formed at the edges of the conductive structures 200. The etched conductive structures 200 have protrusions on their two edges and the protrusions are one of rectangular, triangular, or curved. Therefore, the pattern of the mask layer may be set to a rectangle, a circle, or the like.

According to the pattern set on the first mask material layer 300 in the above steps, the conductive structures 200 are patterned and etched so that the edges of the conductive structures 200 have protrusions. There are two basic etching processes for the manufacturing of semiconductors: dry etching and wet etching. Dry etching is a process in which the plasmas generated in the gaseous state physically and chemically react with the silicon wafer exposed to the plasmas, through a masking window formed by a photolithography process, to etch away the exposed surface material on the silicon wafer. Dry etching is used in fine etching of small feature sizes in advanced circuits. Dry etching is an etching technique that uses gas as the main medium. The semiconductor material does not require liquid chemicals or washing, and the semiconductor material enters and exits the system in a dry state. Compared with wet etching, dry etching shows both chemical isotropy (etching in both vertical and horizontal directions) and physical anisotropy (etching only in the vertical direction).

In this embodiment, the conductive structure 200 may be etched by dry etching. Specifically, the semiconductor structure is conveyed to the reaction chamber, and the pressure in the reaction chamber is decreased by a vacuum system. When the reaction chamber is in vacuum, a reaction gas is introduced into the reaction chamber. For the etching of related conductive materials of integrated circuits such as tungsten and copper, a mixture of nitrogen fluoride and oxygen is usually used as the reaction gas. Alternatively, other fluorine-containing gases may be used as the etching gas, for example carbon tetrafluoride, sulfur hexafluoride, and nitrogen trifluoride. The power supply creates a radio frequency electric field through the electrodes in the reaction chamber. The energy field excites the mixed gas into the plasma state. In the excited state, the etching is performed with the reactive fluorine and the reactive fluorine is converted into volatile components to be discharged by the vacuum system.

Figure 6A:
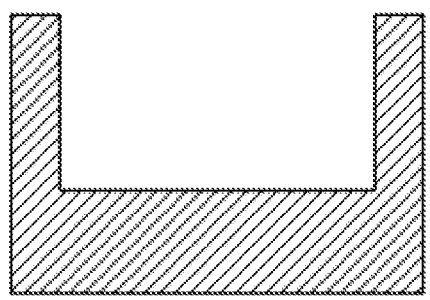
Figure 6B:
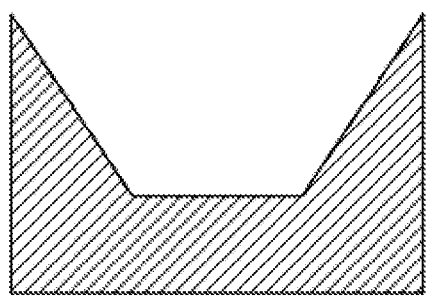
Figure 6C:
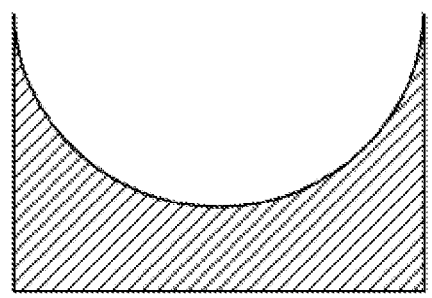

In the semiconductor packaging technology, according to actual process requirements, a curved groove is formed in the central portion of the conductive structures 200, and the top surface of the interconnect structures 201 is at least partially engaged with the curved groove. The etched conductive structures 200 have protrusions on its two edges and the protrusions are rectangular, triangular, or curved. FIGS. 6A-6C are schematic cross-section views of the etched conductive structures 200. For example, FIG. 6A shows rectangular protrusions at the two edges of the etched conductive structures 200; FIG. 6B shows triangular protrusions at the two edges of the etched conductive structures 200; and FIG. 6C shows curved protrusions at the two edges of the etched conductive structures 200. Therefore, the corresponding effect can be obtained by etching according to the pattern set on the mask layer. Further, in practice, generally, the shape of the protrusions formed by the first mask material layer 300 is as shown in FIG. 6A. Other structures may be obtained by changing the shape of the mask, or by forming the shape of FIG. 6A first and then treating by other processes such as oblique ion implantation and then etching. The above other structures may be, for example, protrusions in the shape of FIG. 6B or 6C. Meanwhile, the deposition and etching of the plurality of mask layers can enable the conductive structures 200 to be etched with a better effect.

In some embodiments, the height of the protrusions is at least greater than or equal to one third of that of the fusible portion 400. The edges of the conductive structures 200 have two or more protrusions, and there is a gap between the protrusions. Therefore, sufficient binding force and drainage capacity can be ensured.

Therefore, in this embodiment, compared with other semiconductor packaging processes, the present disclosure is mainly aimed at improving the conductive structures of the substrate. In the new structure design, equivalently, the conductive structures are re-etched. By etching the central portion of the conductive structures, there is a difference in height between the edge and the center. The new structure design can drain the metal solder. This can avoid the diffusion of the metal solder along the coupling direction in the subsequent packaging technology, avoid the contact between the metal solder and the surrounding materials, and prevent the metal solder from melting and then flowing to the surrounding during the subsequent high-temperature heating. Thus, this avoids the short circuit between adjacent conductive structures, the current leakage and poor contact between the substrate and the chip, and the product failure. Meanwhile, the metal solder and the conductive structures are welded on three sides to further strengthen the bonding force between the weld metals, thereby improving the yield rate of the semiconductor packaging process.

Please referring to FIG. 4, a chip 110 is provided, and interconnect structures 201 are formed on the surface of the chip 110. The chip 110 and the substrate 100 are combined. The etched conductive structures 200 are formed on the surface of the substrate 100. Further, the etched conductive structures 200, the interconnect structures 201, and the chip 110 are packaged.

Specifically, interconnect structures 201 are formed on the surface of the chip 110, and the top of the interconnect structures 201 has an exposed fusible portion 400. In this embodiment, the fusible portion 400 is defined to distinguish it from the conductive structures 200. The fusible portion 400 is metal solder, generally tin alloy or the like. Since the conductive structures 200 are relatively infusible at the fusion temperature of the fusible portion 400, the materials of the fusible portion 400 and the conductive structures 200 are different.

The fusible portion 400 and the conductive structures 200 are initially mechanically combined, and then the fusible portion 400 is heated to the reflow temperature of the fusible portion 400 to bond the fusible portion 400 with the conductive structures 200 by thermocompression.

Please referring to FIG. 4 and FIG. 5, FIG. 4 shows this embodiment and FIG. 5 shows a technical solution in the prior art. It may be understood by those skilled in the art that, in the early semiconductor packaging technology, the gap between the conductive structures 200 and the semiconductor substrate 100 is filled with molding compound 500. Due to the fallibility or compactness of the molding compound, when the conductive structures 200 are welded with the interconnect structures 201 on the chip, current leakage, short circuit due to poor contact, product failure and other problems occur between adjacent metal welding materials.

Therefore, compared with other semiconductor packaging processes, this embodiment is mainly aimed at improving the conductive structures of the substrate. In the new structure design, equivalently, the conductive structures are re-etched. By etching the central portion of the conductive structures, there is a difference in height between the edge and the center. The new structure design can drain the metal solder. This can avoid the disordered diffusion of the metal solder in the subsequent packaging technology, and thus avoid the short circuit between adjacent conductive structures. Meanwhile, the metal solder and the conductive structures are welded on three sides to further strengthen the bonding force between the weld metals. This avoids the current leakage, poor contact and other problems between the substrate and the chip, thereby improving the yield rate of the semiconductor packaging process.

In other embodiments of the present disclosure provides a semiconductor structure.

FIG. 4 is a schematic diagram of a semiconductor structure in other embodiments of the present disclosure.

The semiconductor structure specifically comprises a substrate 100 and conductive structures 200.

Conductive structures 200 arranged at intervals are formed on the surface of the substrate 100. The conductive structures 200 are located on the surface of the substrate 100. Further, after the conductive structures 200 are etched, the center of the surface is dented and the edges are protruded. Further, the height of the protrusions is at least greater than or equal to one third of that of the fusible portion 400. The edges of the conductive structures 200 have two or more protrusions, and there is a gap between the protrusions. Therefore, sufficient binding force and drainage capacity can be ensured.

Specifically, in the semiconductor packaging technology, the material of the semiconductor substrate 100 is mostly a printed circuit board. For example, aluminum nitride substrates, aluminum silicon carbide substrates and the like may be used. Conductive structures 200 arranged at intervals are formed on the surface of the substrate 100. In this embodiment, the conductive structures 200 may be pads or traces. In the semiconductor packaging technology, the material of the conductive structures 200 comprises at least one of copper, nickel, gold, tantalum, cobalt, indium, vanadium, and titanium nitride.

According to actual process requirements, referring to the schematic views of the etched conductive structures 200 in FIGS. 6A-6C, for example, the protrusions at the two edges of the etched conductive structures 200 are rectangular, triangular, or curved. FIG. 6A shows rectangular protrusions at the two edges of the etched conductive structures 200; FIG. 6B shows triangular protrusions at the two edges of the etched conductive structures 200; and FIG. 6C shows curved protrusions at the two edges of the etched conductive structures 200. Therefore, the corresponding effect can be obtained by etching according to the pattern set on the mask layer. Further, in practice, generally, the shape of the protrusions formed by the first mask material layer 300 is as shown in FIG. 6A. Other structures may be obtained by changing the shape of the mask, or by forming the shape of FIG. 6A first and then treating by other processes such as oblique ion implantation and then etching. The above other structures may be, for example, protrusions in the shape of FIG. 6B or 6C.

A chip 110 is provided and interconnect structures 201 are formed on the surface of the chip 110. The chip 110 and the substrate 100 are combined. The etched conductive structure 200 is formed on the surface of the substrate 100. Further, the etched conductive structure 200, the interconnect structures 201, and the chip 110 are packaged.

Specifically, interconnect structures 201 are formed on the surface of the chip 110, and the top of the interconnect structures 201 has an exposed fusible portion 400. In this embodiment, the fusible portion 400 is defined to distinguish it from the conductive structures 200. The fusible portion 400 is metal solder, generally tin alloy. Since the conductive structures 200 are relatively infusible at the fusion temperature of the fusible portion 400, the materials of the fusible portion 400 and the conductive structures 200 are different.

The fusible portion 400 and the conductive structures 200 are initially mechanically combined, and then the fusible portion 400 is heated to the reflow temperature of the fusible portion 400 to bond the fusible portion 400 with the conductive structures 200 by thermocompression.

Please referring to FIG. 4 and FIG. 5, FIG. 4 shows this embodiment and FIG. 5 shows a technical solution in the prior art.

It may be understood by those skilled in the art that, in the semiconductor packaging technology, the gap between the conductive structures 200 and the semiconductor substrate 100 is filled with molding compound 500. The molding compound 500 is injected after soldering. In other words, if the soldering is not strong enough, poor contact may occur at the solder joints during the subsequent molding by injection of molding compound 500, or the high-temperature molding may lead to the fusion of the solder, resulting in coupling between adjacent structures and short circuit. Therefore, due to the fallibility or compactness of the materials, current leakage, poor contact, short circuit and other problems may occur between adjacent metal welding materials, resulting in product failure.

Therefore, compared with other semiconductor packaging processes, this embodiment is mainly aimed at improving the conductive structures of the substrate. In the new structure design, equivalently, the conductive structures are re-etched. By etching the central portion of the conductive structures, there is a difference in height between the edge and the center. The new structure design can drain the metal solder. This can avoid the disordered diffusion of the metal solder in the subsequent packaging technology, and thus avoid the short circuit between adjacent conductive structures. Meanwhile, the metal solder and the conductive structures are welded on three sides to further strengthen the bonding force between the weld metals. This avoids the current leakage, poor contact and other problems between the substrate and the chip, thereby improving the yield rate of the semiconductor packaging process.

The foregoing descriptions are merely preferred embodiments of the present disclosure. It should be noted that, for a person of ordinary skill in the art, various improvements and modifications may be made without departing from the principle of the present disclosure, and these improvements and modifications shall be deemed as falling into the protection scope of the present disclosure.

The invention claimed is:

1. A method for forming a semiconductor structure, comprising:
   providing a chip, the chip having interconnect structures on a surface of the chip, a top of each of the interconnect structures having an exposed fusible portion;
   providing a substrate, the substrate having conductive structures on a surface of the substrate;
   patterning the conductive structures so that edges of the conductive structures have protrusions; and
   combining the chip with the substrate so that fusible portions of the interconnect structures and the conductive structures are initially mechanically bonded respectively, and then heating the fusible portions to a reflow temperature of the fusible portions to bond the fusible portions with the conductive structures by thermocompression;
   wherein the patterning the conductive structures comprises:
   forming a first mask material layer on the conductive structures, the first mask material layer exposing the edges of the conductive structures;
   depositing a barrier material layer in the first mask material layer; and
   removing the first mask material layer and forming the protrusions at the edges of the conductive structures.

2. The method for forming a semiconductor structure of claim 1, wherein the patterning the conductive structures comprises:
   forming a second mask material layer on the conductive structures, the second mask material layer covering at least edge portions of the conductive structures; and etching the conductive structures along the second mask material layer and forming the protrusions at the edges of the conductive structures.

3. The method for forming a semiconductor structure of claim 1, wherein the barrier material layer and the conductive structures are made of same or different materials.

4. A semiconductor structure, comprising:
- a substrate having conductive structures on a surface of the substrate, edges of the conductive structures having protrusions, a shape of the protrusions being triangular; and
- a chip having interconnect structures on a surface of the chip, the interconnect structures and the conductive structures fitting with each other face to face;
- wherein a top of each of the interconnect structures has a fusible portion that fits with one of the conductive structures face to face, and a height of each of the protrusions is at least greater than or equal to one third of a height of the fusible portion.

5. The semiconductor structure of claim 4, wherein a central portion of each of the conductive structures has a curved groove, and a top surface of each of the interconnect structures at least partially fits with the curved groove.

6. The semiconductor structure of claim 4, wherein an edge of each of the conductive structures has two or more protrusions, and there is a gap between the two or more protrusions.

* * * * *